(12) United States Patent
Shin et al.

(10) Patent No.: US 12,334,156 B2
(45) Date of Patent: Jun. 17, 2025

(54) MEMORY DEVICE AND METHOD OF OPERATING THE MEMORY DEVICE

(71) Applicant: SK hynix Inc., Icheon-si (KR)

(72) Inventors: Jae Hyeon Shin, Icheon-si (KR); Chang Han Son, Icheon-si (KR); In Gon Yang, Icheon-si (KR); Sung Hyun Hwang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 150 days.

(21) Appl. No.: 18/302,728

(22) Filed: Apr. 18, 2023

(65) Prior Publication Data

US 2024/0177775 A1    May 30, 2024

(30) Foreign Application Priority Data

Nov. 24, 2022   (KR) .................. 10-2022-0159060

(51) Int. Cl.
| | |
|---|---|
| *G11C 16/28* | (2006.01) |
| *G11C 16/04* | (2006.01) |
| *G11C 16/08* | (2006.01) |
| *G11C 16/10* | (2006.01) |
| *G11C 16/34* | (2006.01) |

(52) U.S. Cl.
CPC ........ *G11C 16/102* (2013.01); *G11C 16/0433* (2013.01); *G11C 16/08* (2013.01); *G11C 16/3459* (2013.01)

(58) Field of Classification Search
CPC ..................................... G11C 16/28
See application file for complete search history.

(56) References Cited

U.S. PATENT DOCUMENTS

2020/0013795 A1*   1/2020   Dunga .................. H10B 43/35

FOREIGN PATENT DOCUMENTS

| KR | 1020170006207 A | 1/2017 |
|---|---|---|
| KR | 1020170092006 A | 8/2017 |

\* cited by examiner

*Primary Examiner* — Jason Lappas
(74) *Attorney, Agent, or Firm* — WILLIAM PARK & ASSOCIATES LTD.

(57) ABSTRACT

The present technology relates to an electronic device. A memory device including a plurality of memory cells connected to a plurality of word lines arranged between a plurality of source select lines and a plurality of drain select lines, a peripheral circuit configured to perform a program operation of programming data in selected memory cells among the plurality of memory cells, and a program operation controller configured to control the peripheral circuit to apply a voltage, for turning on or off source select transistors connected to the plurality of source select lines, to the plurality of source select lines, while applying a pass voltage to the plurality of word lines after applying a program voltage to selected word lines connected to the selected memory cells.

15 Claims, 6 Drawing Sheets

MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2022-0159060 filed on Nov. 24, 2022, in the Korean Intellectual Property Office, the entire disclosure of which is incorporated by reference herein.

BACKGROUND

1. Technical Field

The present disclosure generally relates to an electronic device, and more particularly, to a memory device and method of operating the memory device.

2. Related Art

A memory device is a device storing data, and may be classified into a volatile memory device and a nonvolatile memory device.

Meanwhile, during a program operation of the memory device, when source select lines and drain select lines are discharged in a verify phase, a negative boosting phenomenon in which charges are down-coupled to a negative value may occur. At this time, selected word lines positioned on a side of the source select lines may have a relatively low degree of negative boosting, but selected word lines positioned on a side of the drain select lines may have a relatively high degree of negative boosting. That is, a voltage level difference may occur between the selected word lines positioned on the side of the source select lines and the selected word lines positioned on the side of the drain select lines. According to the voltage level difference, disturbance due to hot carrier injection (HCI) may occur.

SUMMARY

According to an embodiment of the present disclosure, a memory device may include a plurality of memory cells connected to a plurality of word lines arranged between a plurality of source select lines and a plurality of drain select lines, a peripheral circuit configured to perform a program operation of programming data in selected memory cells among the plurality of memory cells, and a program operation controller configured to control the peripheral circuit to apply a voltage, for turning on source select transistors connected to the plurality of source select lines, to the plurality of source select lines while applying a pass voltage to the plurality of word lines after applying a program voltage to selected word lines connected to the selected memory cells.

According to an embodiment of the present disclosure, a method of operating a memory device may include applying a program voltage to selected word lines connected to selected memory cells among a plurality of word lines arranged between a plurality of source select lines and a plurality of drain select lines, applying a pass voltage to the plurality of word lines, and initializing the plurality of source select lines while applying the pass voltage to the plurality of word lines.

According to an embodiment of the present disclosure, a method of operating a memory device may include applying a program voltage to selected word lines connected to selected memory cells among a plurality of word lines arranged between a plurality of source select lines and a plurality of drain select lines, applying a pass voltage to the plurality of word lines, measuring a temperature of the memory device, generating a voltage to be applied to the plurality of source select lines while applying the pass voltage to the plurality of word lines according to whether the temperature is less than a preset value, and applying the generated voltage to the plurality of source select lines.

DETAILED DESCRIPTION

Specific structural or functional descriptions of embodiments according to the concept of the present disclosure disclosed in the present specification or application are illustrated only to describe the embodiments according to the concept of the present disclosure. The embodiments according to the concept of the present disclosure may be carried out in various forms and are not limited to the embodiments described in the present specification or application.

An embodiment of the present disclosure provides a memory device and a method of operating the same capable of improving performance of a program operation by improving disturbance due to hot carrier injection (HCI).

According to an embodiment of the present technology, a memory device and a method of operating the memory device may be capable of improving disturbance due to hot carrier injection (HCI).

Figure 1:
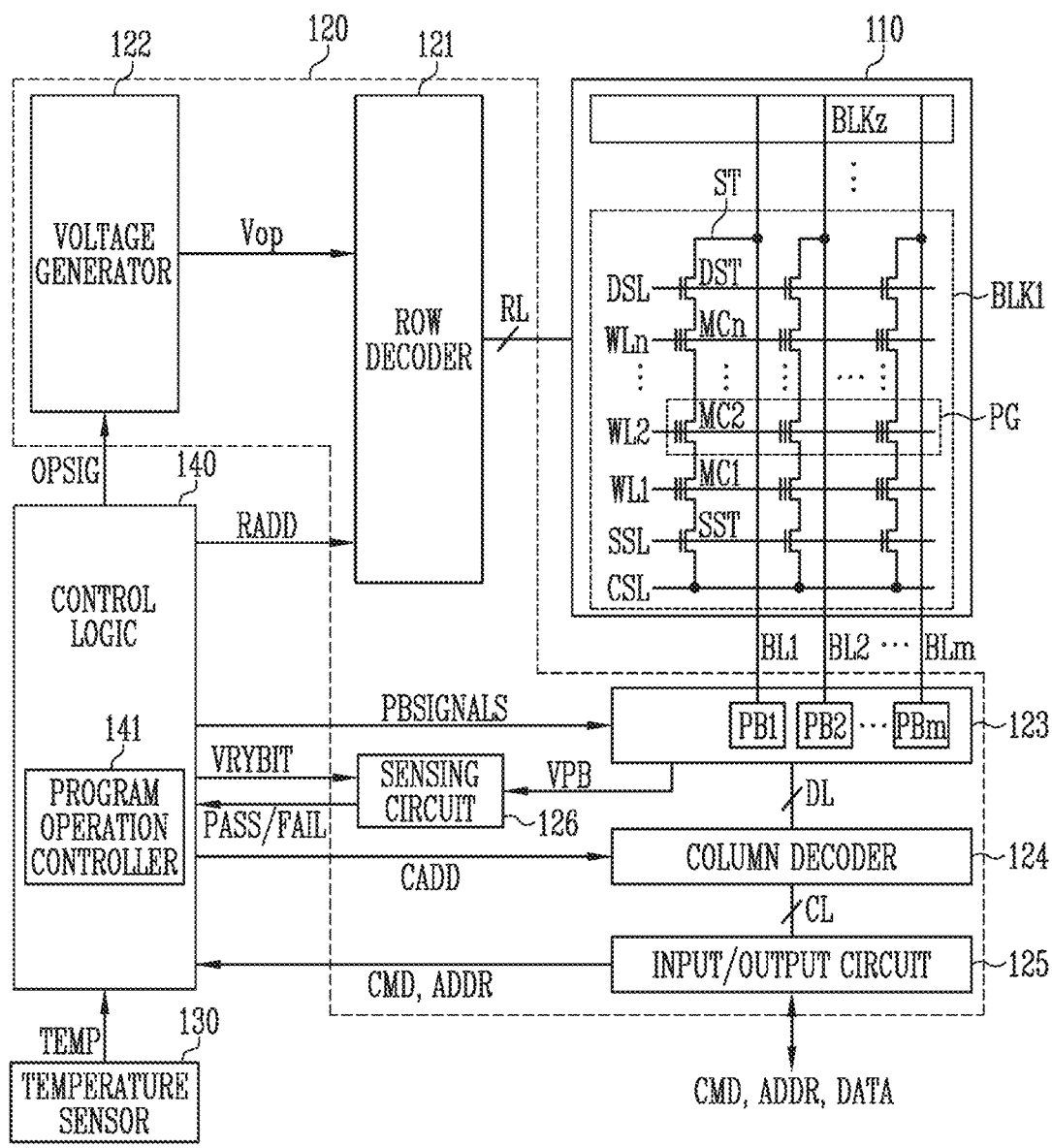
FIG. 1 is a diagram illustrating a memory device according to an embodiment of the present disclosure.

FIG. 1 is a diagram illustrating a memory device 100 according to an embodiment of the disclosure.

Referring to FIG. 1, the memory device 100 may include a memory cell array 110, a peripheral circuit 120, a temperature sensor 130, and control logic 140. The control logic 140 may be implemented as hardware, software, or a combination of hardware and software. For example, the control logic 140 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz may be connected to a page buffer group 123 through bit lines BL1 to BLm. Each of the plurality of memory blocks BLK1 to BLKz includes a plurality of memory cells MC1 to MCn storing data. Each of the memory cells MC1 to MCn may store one or more data bits.

The row lines RL may include at least one source select line SSL, at least one drain select line DSL, and a plurality of word lines WL1 to WLn arranged in parallel with each other between the source select line SSL and the drain select line DSL. In an embodiment, the word lines WL1 to WLn may include normal word lines and dummy word lines. In an embodiment, the row lines RL may further include a pipe select line.

In addition, the plurality of memory blocks BLK1 to BLKz may include a plurality of memory cell strings ST connected between the bit lines BL1 to BLm and a common source line CSL. The bit lines BL1 to BLm may be respectively connected to the memory cell strings ST, and the common source line CSL may be commonly connected to the memory cell strings ST. The memory cell string ST may include at least one source select transistor SST, the plurality of memory cells MC1 to MCn, and at least one drain select transistor DST connected in series between the common source line CSL and the bit lines BL1 to BLm.

Memory cells connected to the same word line may be defined as one page PG. Therefore, one memory block may include a plurality of pages PG. In an embodiment, a page may be a unit for storing data in the memory device 100 or reading data stored in the memory device 100. A memory block may be a unit for erasing data.

The peripheral circuit 120 may be configured to perform a program operation, a read operation, or an erase operation on a selected area of the memory cell array 110 under control of the control logic 140. The peripheral circuit 120 may drive the memory cell array 110. For example, the peripheral circuit 120 may apply various operation voltages to the row lines RL and the bit lines BL1 to BLm or discharge the applied voltages under the control of the control logic 140.

The peripheral circuit 120 may include a row decoder 121, a voltage generator 122, the page buffer group 123, a column decoder 124, an input/output circuit 125, and a sensing circuit 126.

The row decoder 121 is connected to the memory cell array 110 through the row lines RL.

The row decoder 121 is configured to decode a row address RADD received from the control logic 140. The row decoder 121 selects at least one memory block among the memory blocks BLK1 to BLKz according to a decoded address. In addition, the row decoder 121 may select at least one word line of the memory block selected to apply voltages generated by the voltage generator 122 to at least one word line according to the decoded address.

The voltage generator 122 may generate various operation voltages Vop such as a program voltage, a verify voltage, and a pass voltage using an external power voltage supplied to the memory device 100. The generated voltages may be supplied to the memory cell array 110 by the row decoder 121.

The page buffer group 123 includes first to m-th page buffers PB1 to PBm. The first to m-th page buffers PB1 to PBm may store data received through the first to m-th bit lines BL1 to BLm, or may sense a voltage or a current of the bit lines BL1 to BLm during the read operation or a verify operation, in response to page buffer control signals PBSIGNALS.

Specifically, during the program operation, when a program pulse is applied to a selected word line, the first to m-th page buffers PB1 to PBm may transfer data DATA received through the input/output circuit 125 to selected memory cells through the first to m-th bit lines BL1 to BLm. The memory cells of the selected page are programmed according to the transferred data DATA. A memory cell connected to a bit line to which a program allowable voltage (for example, a ground voltage) is applied may have an increased threshold voltage. A threshold voltage of a memory cell connected to a bit line to which a program inhibit voltage (for example, a power voltage) is applied may be maintained. During a program verify operation, the first to m-th page buffers PB1 to PBm read page data from the selected memory cells through the first to m-th bit lines BL1 to BLm.

The column decoder 124 may transfer data between the input/output circuit 125 and the page buffer group 123 in response to a column address CADD. For example, the column decoder 124 may exchange data with the first to m-th page buffers PB1 to PBm through data lines DL, or may exchange data with the input/output circuit 125 through column lines CL.

The input/output circuit 125 may transfer a command CMD and an address ADDR received from an external memory controller (not shown) to the control logic 140, or may exchange the data DATA with the column decoder 124.

The sensing circuit 126 may generate a reference current in response to an allowable bit signal VRYBIT during the verify operation, and compare a sensing voltage VPB received from the page buffer group 123 with a reference voltage generated by the reference current to output a pass signal PASS or a fail signal FAIL.

The temperature sensor 130 may measure a temperature of the memory device 100. The temperature sensor 130 may provide a temperature signal TEMP having a different voltage level according to the measured temperature to the control logic 140. The control logic 140 may generate temperature information indicating the temperature of the memory device 100 according to the temperature signal TEMP.

Meanwhile, the temperature sensor 130 is shown as one configuration of the memory device 100 in FIG. 1, but the temperature sensor 130 is not necessarily limited thereto. For example, the temperature sensor 130 may be a separate and independent device positioned outside the memory device 100.

The control logic 140 may output an operation signal OPSIG, the row address RADD, the page buffer control signals PBSIGNALS, and the allowable bit signal VRYBIT in response to the command CMD and the address ADDR to control the peripheral circuits 120. In addition, the control logic 140 may determine whether the verity operation is passed or failed in response to the pass signal PASS or the fail signal FAIL.

In an embodiment, the control logic 140 may include a program operation controller 141.

The program operation controller 141 may control the peripheral circuit 120 to perform the program operation. For example, the program operation controller 141 may control the voltage generator 122 to generate the program voltage, the pass voltage, the verify voltage, a verify pass voltage, a voltage for turning on the source select transistor, a voltage for turning on the drain select transistor, a ground voltage, and the like, which are used to perform the program operation. In addition, the program operation controller 141 may control the row decoder 121 to apply the generated voltages to corresponding lines.

The program operation may include a program phase of providing the program voltage and a verify phase of determining whether the memory cells are programmed by applying the verify voltages. The program operation is described in detail with reference to FIG. 2 to be described later.

In an embodiment, the program operation controller 141 may control the peripheral circuit 120 to turn on the source select transistors connected to the plurality of source select lines SSL, while applying the pass voltage to the plurality of word lines WL1 to WLn after applying the program voltage to the selected word lines connected to the selected memory cells. That is, the program operation controller 141 may initialize the plurality of source select lines SSL in a period in which the pass voltage is maintained before the verify phase. In addition, the program operation controller 141 may determine whether to initialize the plurality of source select lines SSL in the period in which the pass voltage is maintained before the verify phase, based on the temperature of the memory device 100. An operation of initializing the plurality of source select lines SSL is described in detail with reference to FIGS. 3 to 6 to be described later.

Figure 2:
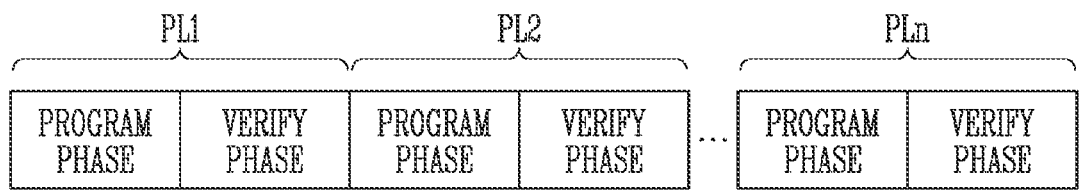
FIG. 2 is a diagram illustrating a program operation according to an embodiment of the present disclosure.

FIG. 2 is a diagram illustrating a program operation according to an embodiment of the present disclosure.

Referring to FIG. 2, the program operation of the memory device 100 may include a plurality of program loops PL1 to PLn. That is, the memory device 100 may perform the program operation so that the selected memory cells have a threshold voltage corresponding to any one of a plurality of program states by performing the plurality of program loops PL1 to PLn.

Each of the plurality of program loops PL1 to PLn may include a program phase PROGRAM PHASE of providing the program voltage and a verify phase VERIFY PHASE of determining whether the memory cells are programmed by applying the verify voltages.

For example, when a first program loop PL1 is performed, after a first program pulse is applied in the program phase PROGRAM PHASE, the verify voltages are sequentially applied to verify the program state of the plurality of memory cells in the verify phase VERIFY PHASE.

Memory cells of which verification is passed by each of the verify voltages are determined to have a target program state, and then program-inhibited in a second program loop PL2. A second program pulse higher than the first program pulse by a unit voltage is applied to program remaining memory cells except for the program-inhibited memory cells in the second program loop PL2. Thereafter, a verify operation is performed identically to the verify operation of the first program loop PL1. For example, a verify pass indicates that the memory cell is read as an off-cell by a corresponding verify voltage.

During the verify phase VERIFY PHASE, the verify voltage may be applied to the selected word line, which is a word line to which the selected memory cells are connected, and the page buffer may determine whether the verification of the memory cells is passed based on the current or the voltage flowing through the bit lines respectively connected to the selected memory cells.

For example, the memory device 100 may store a state of the memory cell according to the voltage of the bit line. Here, the state of the memory cell may be a state corresponding to any one of a verify pass or a verify fail. When a threshold voltage of the memory cell is higher than the verify voltage applied to the selected word line, the memory cell may be read as an off-cell, and the memory cell read as the off-cell may correspond to a verify pass state. Conversely, when the threshold voltage of the memory cell is lower than the verify voltage applied to the selected word line, the memory cell may be read as an on-cell, and the memory cell read as the on-cell may correspond to a verify fail state.

Figure 3:
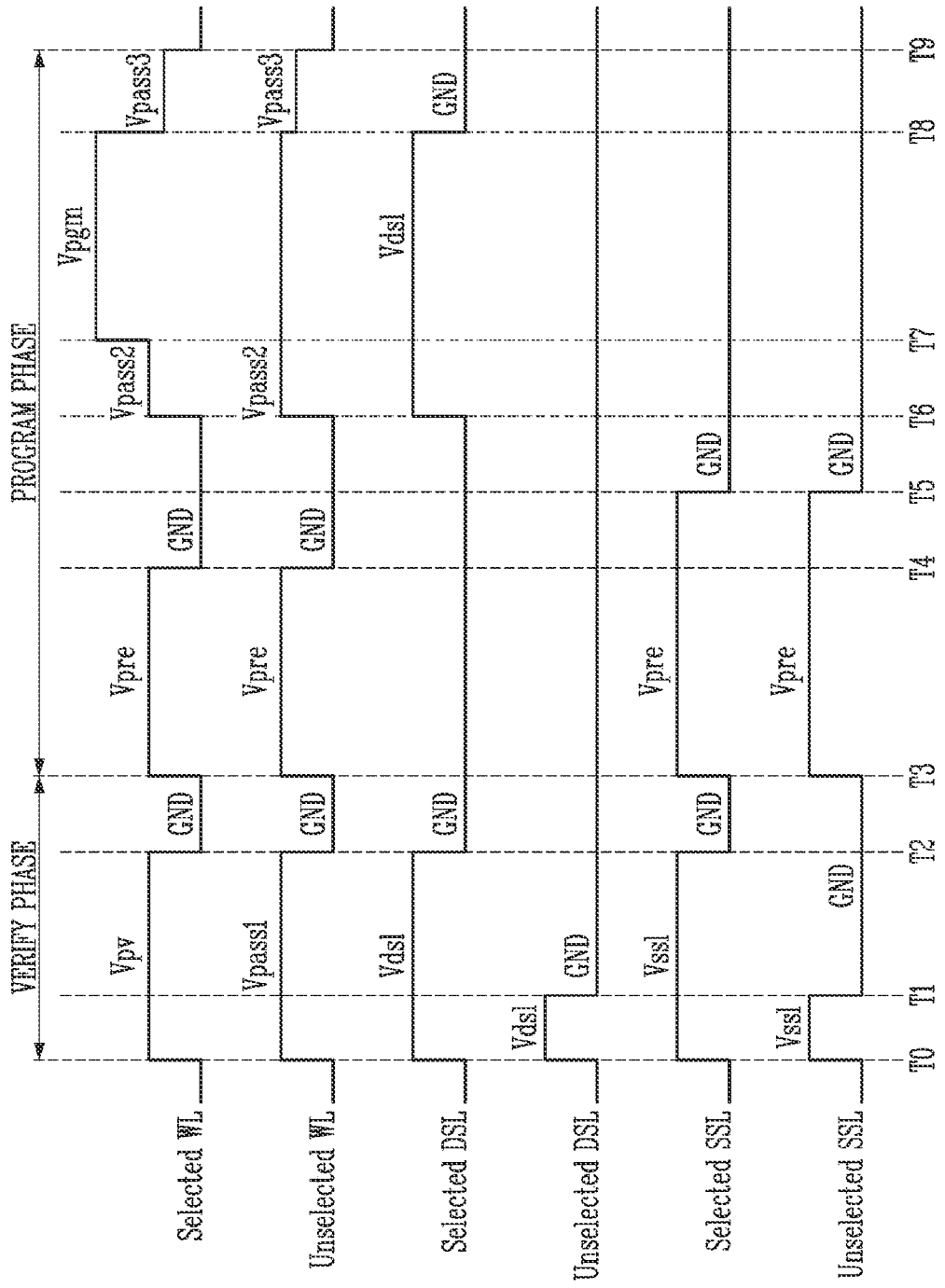
FIG. 3 is a waveform diagram illustrating voltages applied during a program operation according to an embodiment of the present disclosure.

FIG. 3 is a waveform diagram illustrating voltages applied during a program operation according to an embodiment of the present disclosure.

In FIGS. 3, T0 to T3 indicate the verify phase VERIFY PHASE, and T3 to T9 indicate the program phase PROGRAM PHASE.

In an embodiment, the verify phase VERIFY PHASE may be a verify phase VERIFY PHASE of an i-th program loop, and the program phase PROGRAM PHASE may be a program phase PROGRAM PHASE of an (i+1)-th program loop.

At T0, the memory device 100 may apply a verify voltage Vpv to selected word lines Selected WL and apply a verify pass voltage Vpass1 to unselected word lines Unselected WL. The verify voltage Vpv may be a voltage for determining the program state of the selected memory cells. The verify pass voltage Vpass1 may be a voltage at which the memory cells connected to the unselected word lines Unselected WL are turned on so that a voltage of the bit line is not affected. In an embodiment, the verify pass voltage Vpass1 may be higher than the verify voltage Vpv.

In addition, the memory device 100 may apply a drain select voltage Vdsl for turning on the drain select transistors to selected drain select lines Selected DSL. In addition, the memory device 100 may apply the drain select voltage Vdsl for turning on the drain select transistors to unselected drain select lines Unselected DSL. This is to, in an embodiment, prevent or mitigate a channel potential of unselected memory cell string from excessively increasing due to a high potential verify pass voltage Vpass1 applied to the unselected word lines Unselected WL.

In addition, the memory device 100 may apply a source select voltage Vssl for turning on the source select transistors to selected source select lines Selected SSL. In addition, the memory device 100 may apply the source select voltage Vssl for turning on the source select transistors to unselected source select lines Unselected SSL. This is to, in an embodiment, prevent or mitigate the channel potential of the unselected memory cell string from excessively increasing due to the high potential verify pass voltage Vpass1 applied to the unselected word lines Unselected WL.

At T1, the memory device 100 may discharge the unselected drain select lines Unselected DSL and the unselected source select lines Unselected SSL. The memory device 100 may apply a ground voltage GND for turning off the drain select transistors connected to the unselected drain select lines Unselected DSL and the source select transistors connected to the unselected source select lines Unselected SSL to the unselected drain select lines Unselected DSL and the unselected source select lines Unselected SSL.

At T2, the memory device 100 may discharge the selected word lines Selected WL, the unselected word lines Unselected WL, the selected drain select lines Selected DSL, and the selected source select lines Selected SSL. The memory device 100 may apply the ground voltage GND to the selected word lines Selected WL, the unselected word lines Unselected WL, the selected drain select lines Selected DSL, and the selected source select lines Selected SSL.

At T3, the memory device 100 may apply a precharge voltage Vpre to the selected word lines Selected WL and the unselected word lines Unselected WL. Accordingly, a voltage of the selected word lines Selected WL and the unselected word lines Unselected WL may increase.

In addition, the memory device 100 may precharge a channel area of the plurality of memory cell strings. For example, the memory device 100 may also apply the precharge voltage Vpre applied through the common source line CSL to the selected source select lines Selected SSL and the unselected source select lines Unselected SSL of each of the plurality of memory cell strings. Accordingly, a voltage of the selected source select lines Selected SSL and the unselected source select lines Unselected SSL may increase.

In addition, the memory device 100 may apply the ground voltage GND for turning off the drain select transistor to the selected drain select lines Selected DSL and the unselected drain select lines Unselected DSL, which are the drain select lines of the selected memory cell string. Accordingly, a voltage of the selected drain select lines Selected DSL and the unselected drain select lines Unselected DSL may decrease. In an embodiment, a period from T3 to T4 may be an all string precharge period.

At T4, the memory device 100 may apply the ground voltage GND to the selected word lines Selected WL and the unselected word lines Unselected WL. Accordingly, the voltage of the selected word lines Selected WL and the unselected word lines Unselected WL may decrease.

At T5, the memory device 100 may apply the ground voltage GND to the selected source select lines Selected SSL and the unselected source select lines Unselected SSL. Accordingly, the voltage of the selected source select lines Selected SSL and the unselected source select lines Unselected SSL may decrease.

At T6, the memory device 100 may apply a pass voltage Vpass2 to the selected word lines Selected WL and the unselected word lines Unselected WL. In addition, the memory device 100 may apply the drain select voltage Vdsl for turning on the drain select transistors to the selected drain select lines Selected DSL.

At T7, the memory device 100 may provide a program voltage Vpgm to the selected word lines Selected WL. The voltage of the unselected word lines Unselected WL may maintain the pass voltage Vpass2. In an embodiment, the pass voltage Vpass2 may be lower than the program voltage Vpgm.

At T8, the memory device 100 may apply a pass voltage Vpass3 to the selected word lines Selected WL and the unselected word lines Unselected WL. A period from T8 to T9 may be a pass voltage maintenance period. That is, the pass voltage maintenance period may be a period in which the pass voltage Vpass3 of the plurality of word lines Selected WL and Unselected WL is maintained before the verify phase VERIFY PHASE is performed after applying the program voltage. In addition, the memory device 100 may apply the ground voltage GND for turning off the drain select transistors to the selected drain select lines Selected DSL.

At T9, the program phase PROGRAM PHASE may be ended, and a verify phase VERIFY PHASE of an (i+1)-th program loop may be performed.

Figure 4:
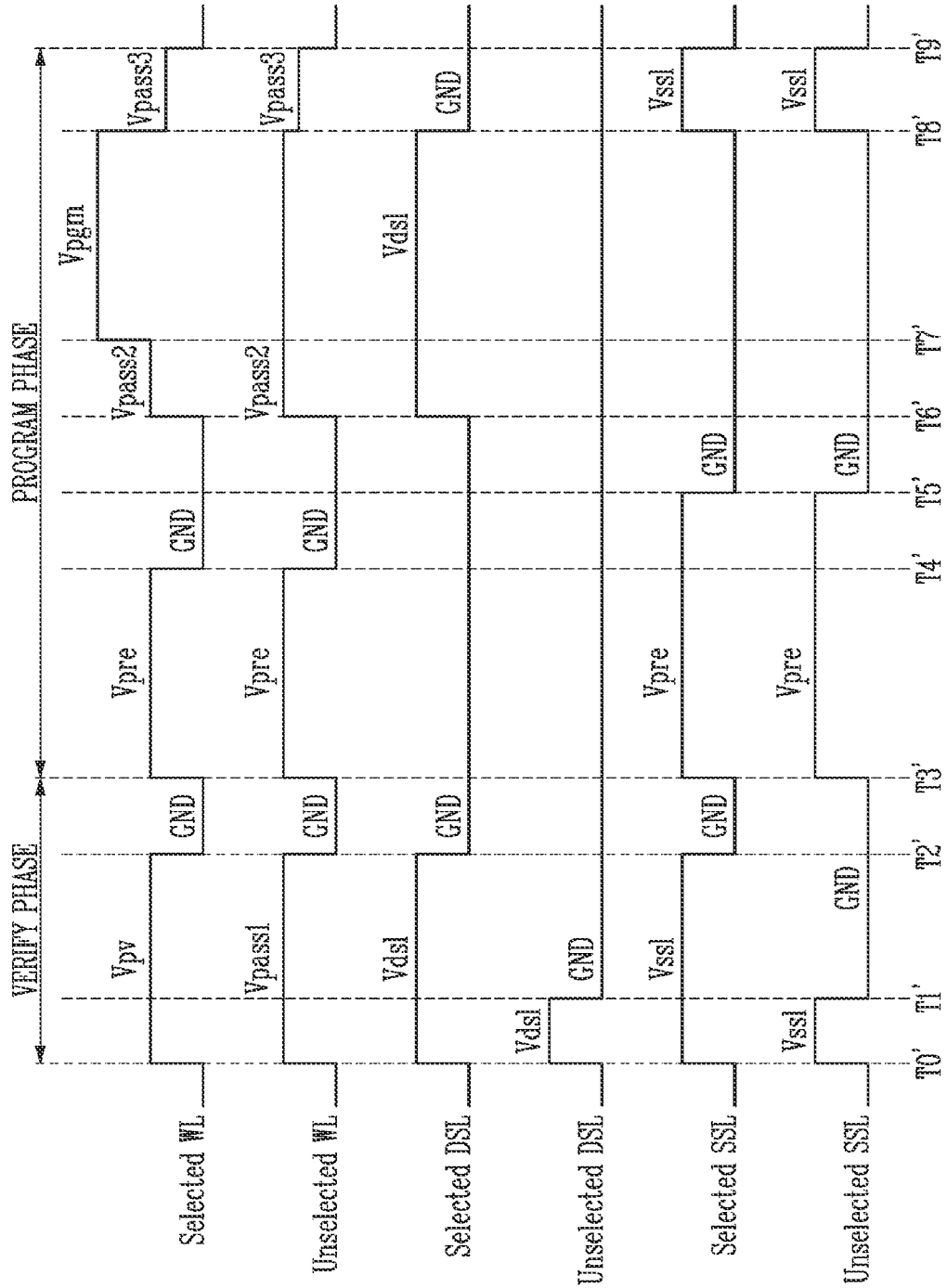
FIG. 4 is a waveform diagram illustrating a method of operating a memory device according to an embodiment of the present disclosure.

FIG. 4 is a waveform diagram illustrating a method of operating a memory device according to an embodiment of the present disclosure.

An operation of the memory device 100 from T0' to T8' of FIG. 4 are the same as that of the memory device 100 from T0 to T8 of FIG. 3, and thus a detailed description is omitted.

At T8', the memory device 100 may apply the pass voltage Vpass3 to the selected word lines Selected WL and the unselected word lines Unselected WL.

In addition, the memory device 100 may apply the ground voltage GND for turning off the drain select transistors to the selected drain select lines Selected DSL. Accordingly, the drain select transistors connected to the selected drain select lines Selected DSL and the unselected drain select lines Unselected DSL may be turned off.

In an embodiment, the memory device 100 may apply the source select voltage Vssl for turning on the source select transistors connected to the plurality of source select lines Selected SSL and Unselected SSL. That is, the memory device 100 may turn on the plurality of source select lines Selected SSL and Unselected SSL while the pass voltage Vpass3 is applied to the plurality of word lines Selected WL and Unselected WL after the application of the program voltage Vpgm. In this embodiment, compared to the operation method of FIG. 3, a degree of negative boosting of selected word lines Selected WL positioned on a side of the source select lines Selected SSL and Unselected SSL may be higher. Accordingly, in an embodiment, a voltage difference between the selected word lines Selected WL positioned on the side of the source select lines Selected SSL and Unselected SSL and the selected word lines Selected WL positioned on a side of the drain select lines Selected DSL and Unselected DSL may be reduced, and thus hot carrier injection (HCI) may be mitigated. In an embodiment, at T8' the source select transistors may be turned on by applying a source select voltage Vssl to the selected source select lines Selected SSL and the unselected source select lines Unselected SSL when the temperature of the memory device 100 is less than a preset value. In an embodiment, referring to FIG. 3, at T8 the source select transistors may be turned off or maintained as turned off by applying or maintaining the application of a ground voltage GND to the selected source select lines Selected SSL and the unselected source select lines Unselected SSL when the temperature of the memory device 100 is greater than or equal to a preset value.

Therefore, according to an embodiment of the present disclosure, disturbance due to the HCI may be improved by turning on the source select transistors connected to the source select lines in a pass voltage maintenance period.

Figure 5:
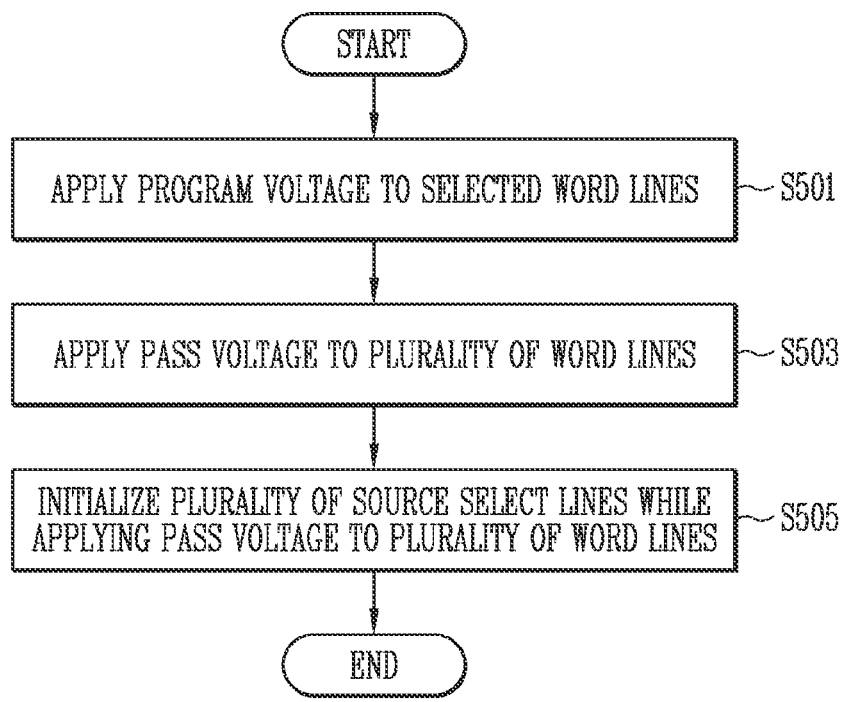
FIG. 5 is a flowchart illustrating an example of a method of operating a memory device according to an embodiment of the disclosure.

FIG. 5 is a flowchart illustrating an example of a method of operating a memory device according to an embodiment of the disclosure.

Referring to FIG. 5, in step S501, the memory device 100 may apply the program voltage to the selected word lines connected to the selected memory cells.

In step S503, the memory device 100 may apply the pass voltage to the plurality of word lines.

In step S505, the memory device 100 may initialize the plurality of source select lines while applying the pass voltage to the plurality of word lines. For example, the memory device 100 may turn on the source select transistors connected to the plurality of source select lines and turn off the drain select transistors connected to the plurality of drain select lines.

Meanwhile, the memory device 100 may determine whether to turn on the source select transistors while maintaining the pass voltage according to whether the temperature is lower than a preset value. This is described in detail with reference to FIG. 6 to be described later.

Figure 6:
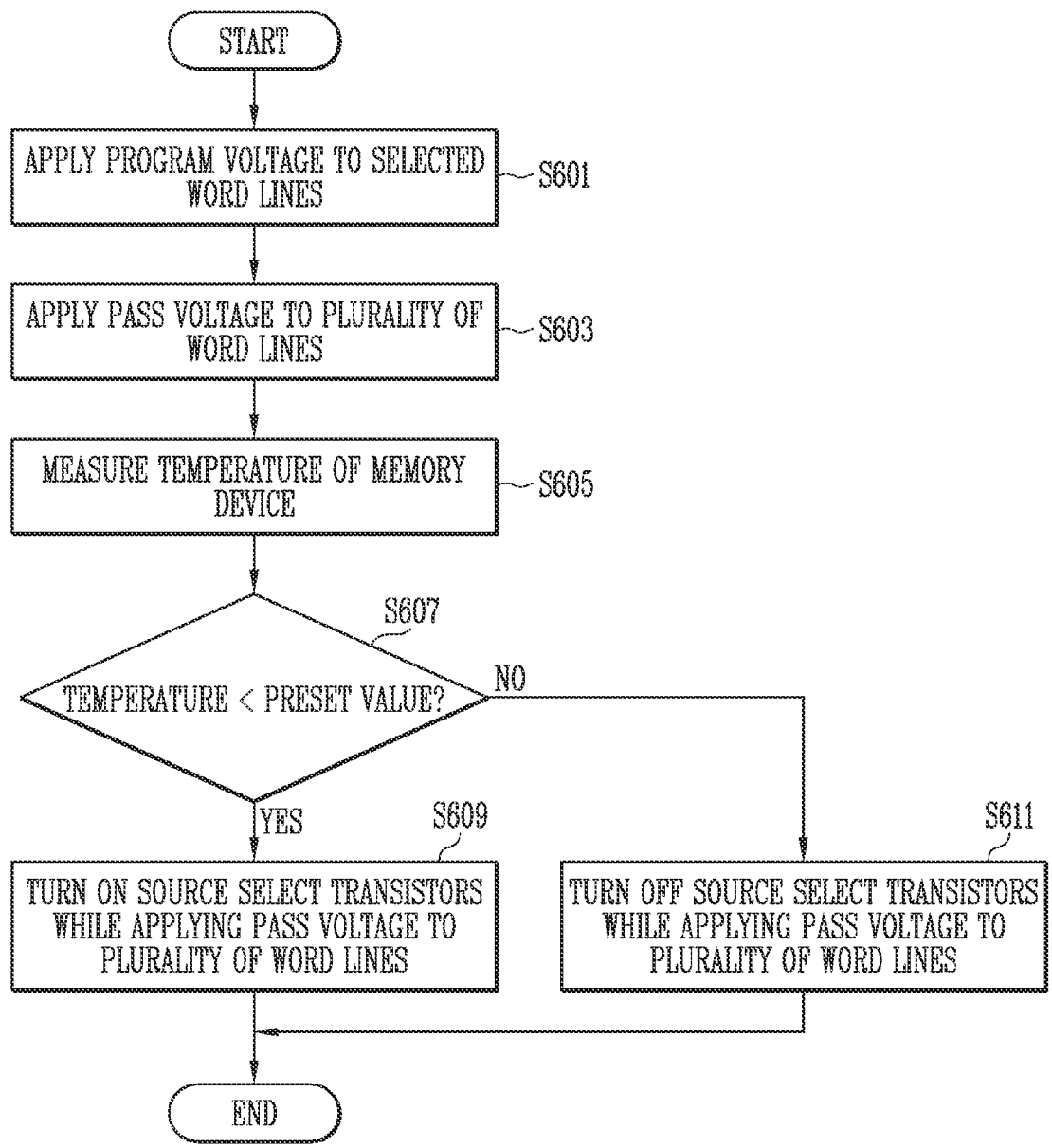
FIG. 6 is a flowchart illustrating another example of a method of operating a memory device according to an embodiment of the disclosure.

FIG. 6 is a flowchart illustrating another example of a method of operating a memory device according to an embodiment of the disclosure.

Referring to FIG. 6, in step S601, the memory device 100 may apply the program voltage to the selected word lines connected to the selected memory cells.

In step S603, the memory device 100 may apply the pass voltage to the plurality of word lines.

In step S605, the memory device 100 may measure the temperature of the memory device 100.

In step S607, the memory device 100 may determine whether the temperature is less than the preset value. The word "preset" as used herein with respect to a parameter, such as a preset value, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

When the temperature is lower than the preset value according to a determination result in step S607, the memory device 100 may turn on the source select transistors connected to the plurality of source select lines in step S609. For example, the memory device 100 may generate a voltage for turning on the source select transistors and apply the generated voltage to the plurality of source select lines.

When the temperature is equal to or greater than the preset value according to the determination result in step S607, the memory device 100 may turn off the source select transistors connected to the plurality of source select lines in step S611. For example, the memory device 100 may generate a voltage for turning off the source select transistors and apply the generated voltage to the plurality of source select lines.

That is, when the temperature is less than the preset value according to the determination result in step S607, the memory device 100 may operate according to the method described with reference to FIG. 4, and when the temperature is equal to or greater than the preset value according to the determination result in step S607, the memory device 100 may operate according to the method described with reference to FIG. 3.

What is claimed is:

1. A memory device comprising:
   a plurality of memory cells connected to a plurality of word lines arranged between a plurality of source select lines and a plurality of drain select lines;
   a peripheral circuit configured to perform a program operation of programming data in selected memory cells among the plurality of memory cells; and
   a program operation controller configured to control the peripheral circuit to apply a voltage, for turning on source select transistors connected to the plurality of source select lines, to the plurality of source select lines while applying a pass voltage to the plurality of word lines after applying a program voltage to selected word lines connected to the selected memory cells.

2. The memory device of claim 1, wherein the program operation controller controls the peripheral circuit to apply a voltage, for turning off drain select transistors connected to the plurality of drain select lines, to the plurality of drain select lines while applying the pass voltage to the plurality of word lines.

3. The memory device of claim 1, wherein the program operation controller controls the peripheral circuit to precharge a channel area of a plurality of memory cell strings each including the plurality of source select lines and the plurality of drain select lines, before applying the program voltage to the selected word lines.

4. The memory device of claim 1, wherein the program operation controller controls the peripheral circuit to discharge the plurality of source select lines and the plurality of drain select lines, after applying the pass voltage to the plurality of word lines.

5. The memory device of claim 4, wherein the program operation controller controls the peripheral circuit to verify a program state of the selected memory cells after the discharge.

6. The memory device of claim 1, further comprising;
   a temperature sensor configured to measure a temperature of the memory device.

7. The memory device of claim 6, wherein the program operation controller controls the peripheral circuit to apply the voltage for turning on the source select transistors to the plurality of source select lines, while applying the pass voltage to the plurality of word lines, when the temperature is less than a preset value.

8. The memory device of claim 6, wherein the program operation controller controls the peripheral circuit to apply a voltage for turning off the source select transistors connected to the plurality of source select lines, while applying the pass voltage to the plurality of word lines, when the temperature is equal to or greater than the preset value.

9. A method of operating a memory device, the method comprising:
   applying a program voltage to selected word lines connected to selected memory cells among a plurality of word lines arranged between a plurality of source select lines and a plurality of drain select lines;
   applying a pass voltage to the plurality of word lines; and
   initializing the plurality of source select lines while applying the pass voltage to the plurality of word lines.

10. The method of claim 9, wherein initializing comprises turning on source select transistors connected to the plurality of source select lines.

11. The method of claim 10, wherein initializing further comprises turning off drain select transistors connected to the plurality of drain select lines.

12. The method of claim 9, further comprising:
   precharging a channel area of a plurality of memory cell strings each including the plurality of source select lines and the plurality of drain select lines, before applying the program voltage to the selected word lines.

13. A method of operating a memory device, the method comprising:
   applying a program voltage to selected word lines connected to selected memory cells among a plurality of word lines arranged between a plurality of source select lines and a plurality of drain select lines;
   applying a pass voltage to the plurality of word lines;
   measuring a temperature of the memory device;
   generating a voltage to be applied to the plurality of source select lines while applying the pass voltage to the plurality of word lines according to whether the temperature is less than a preset value; and
   applying the generated voltage to the plurality of source select lines.

14. The method of claim 13, wherein generating the voltage comprises generating a voltage for turning on source select transistors connected to the plurality of source select lines in response to the temperature being less than the preset value.

15. The method of claim 13, wherein generating the voltage comprises generating a voltage for turning off source select transistors connected to the plurality of source select lines in response to the temperature being equal to or greater than the preset value.

* * * * *